(12) United States Patent
Launay et al.

(10) Patent No.: US 9,792,541 B2
(45) Date of Patent: Oct. 17, 2017

(54) SMART CARD COMPRISING A PROTRUDING COMPONENT AND METHOD FOR MAKING SAME

(75) Inventors: François Launay, Epron (FR); Jacques Venambre, Ifs (FR)

(73) Assignee: OBERTHUR TECHNOLOGIES, Levallois Perret (FR)

( * ) Notice: Subject to any disclaimer, the term of this patent is extended or adjusted under 35 U.S.C. 154(b) by 1338 days.

(21) Appl. No.: 10/532,862

(22) PCT Filed: Oct. 23, 2003

(86) PCT No.: PCT/FR03/03139
§ 371 (c)(1),
(2), (4) Date: Apr. 24, 2006

(87) PCT Pub. No.: WO2004/040507
PCT Pub. Date: May 13, 2004

(65) Prior Publication Data
US 2006/0237542 A1 Oct. 26, 2006

(30) Foreign Application Priority Data
Oct. 28, 2002 (FR) ..................... 02 13465

(51) Int. Cl.
*G06K 19/06* (2006.01)
*G06K 19/07* (2006.01)
*G06K 19/077* (2006.01)

(52) U.S. Cl.
CPC ....... *G06K 19/0718* (2013.01); *G06K 19/077* (2013.01); *G06K 19/07703* (2013.01); *G06K 19/07745* (2013.01); *H01L 2224/48091* (2013.01); *H01L 2224/48227* (2013.01)

(58) Field of Classification Search
CPC .................... G06K 19/07749; G06K 19/0775
USPC ................................ 235/492, 487, 488, 486
See application file for complete search history.

(56) References Cited

U.S. PATENT DOCUMENTS 4,682,017 A * 7/1987 Nakahara et al. ............. 235/492
5,581,445 A * 12/1996 Horejs et al. ................. 361/737
6,239,976 B1 * 5/2001 Templeton et al. ........... 361/737

FOREIGN PATENT DOCUMENTS

EP 0 234 954 9/1987
FR 2 662 896 12/1991
FR 2 776 796 10/1999

* cited by examiner

*Primary Examiner* — Daniel St Cyr
(74) *Attorney, Agent, or Firm* — Young & Thompson

(57) ABSTRACT

The invention concerns a smart card comprising a microcircuit, at least one other component including a protruding component and external contacts in a card-holder. The invention is characterized in that the microcircuit (1), the protruding component (2) and the external contacts (12) form part of a subassembly (S1) fixed in a housing (C1+C2+C3) provided in part of the thickness of the card-holder, said subassembly including a support film (10) bearing on one inner surface the microcircuit (1) and at least the protruding component (2) and on one outer surface the external contacts (12), a window (11) being arranged in said film opposite part of the projecting component.

22 Claims, 3 Drawing Sheets

SMART CARD COMPRISING A PROTRUDING COMPONENT AND METHOD FOR MAKING SAME

CROSS-REFERENCE TO RELATED APPLICATIONS

The present Application incorporates by reference and claims priority to PCT/FR2003/003139 filed Oct. 23, 2003 and French Patent Application No. 02/13465 filed Oct. 28, 2002.

STATEMENT REGARDING FEDERALLY SPONSORED RESEARCH OR DEVELOPMENT

None.

THE NAMES OF THE PARTIES TO A JOINT RESEARCH AGREEMENT. INCORPORATION-BY-REFERENCE OF MATERIAL SUBMITTED ON A COMPACT DISC

None.

BACKGROUND OF THE INVENTION

Field of the Invention

The invention relates to a smart card including a microcircuit (or integrated circuit) provided with external contacts and one or more other components, including an accessible component, such as a display, a detector (for example a fingerprint detector) or a sender (for example an optical sender), i.e. a component that has to be accessible on the surface of the card (without necessarily projecting therefrom).

Description of Related Art

A standard method of fabricating a smart card incorporating a single microprocessor microcircuit consists in forming a cavity in the card support (which in practice is made of a plastic material) and sticking therein a module consisting of the microprocessor microcircuit and its external contacts connected to the microcircuit. On the subject see U.S. Pat. No. 6,372,541.

When the smart card is intended to incorporate, in addition to a microcircuit module (forming together with an antenna a system known as a communication interface), another electronic component that is accessible on the surface, the document WO 99/50790 proposes to connect the electronic component to the communication interface by means of conductive wires, temporarily fixing the resulting assembly against a first plastic material plate, placing a second plastic material plate on top of that assembly, an opening being provided either in the first plate or in the second plate to serve as a housing for the electronic component, and then fastening the two plates together, enclosing the interface and the electronic component.

The above method necessitates dedicated equipment for positioning the assembly in the middle of the plastic structure before the final manufacturing step and providing appropriate openings in the plates. Furthermore, the communication interface and the component accessible at the surface must be able to withstand the temperature at which the plates are fastened together, typically temperatures of at least 140° C., for example, in the case of laminating the plates as proposed in the document cited above.

The document EP-0 908 844 and U.S. Pat. No. 6,320,753, relating to an earlier invention of the Applicant, propose a smart card combining external contact areas and an antenna and comprising a microcircuit connected to the antenna and to external contact areas via connecting terminals, the antenna being disposed between a support and a plate and the connecting terminals being disposed facing corresponding connecting ends of the microcircuit. The microcircuit and the antenna are mounted separately and the concept of disposition between a plate and a support applies.

A sandwich configuration of the above kind is disclosed in the document EP-0 234 954, which describes a smart card formed of a PC card between two plates, and in U.S. Pat. No. 5,412,192, which relates to a card in whose support an antenna is buried and in which a display component is laminated to the interior of the card.

As indicated a propose the first prior art document, the diverse solutions are complex and using them often implies processing that it must be possible to carry out without damaging the components.

One aspect of the invention is a smart card including a microcircuit and one or more other components, including an accessible component, the fabrication of which is simple and reliable, without necessitating processes that are aggressive to the components or lead to mechanical weakening of the card, and in which bending forces applied to the card are advantageously localized at locations where they have only limited consequences.

Another aspect of the invention is a method of fabricating a smart card of the above kind.

BRIEF SUMMARY OF THE INVENTION

To this end the invention proposes a smart card including a microcircuit, one or more other components, including an accessible component, and external contacts in a card support, characterized in that the microcircuit, the accessible component and the external contacts form part of a subassembly fixed in a housing formed in a portion of the thickness of the card support, that subassembly including a support film carrying on an internal face the microcircuit and at least the accessible component and on an external face the external contacts, a window being formed in the support film facing a portion of the accessible component.

For the fabrication of the smart card of the above kind, the invention further proposes a method of fabricating a smart card including a microcircuit and at least one other component including an accessible component, the method including the following steps:

assembling a subassembly by mounting on a support film the microcircuit and at least the accessible component, providing in the film a window for access to the accessible component, and making the connections by means of connecting wires, forming a housing in the card support, fixing the subassembly in the housing.

Clearly the invention proposes a simple solution to the problem of fabricating a smart card incorporating a microprocessor microcircuit with external contacts and one or more accessible components, since it proposes the use of well-known and proven techniques, whereby the connections are made by wires between components for which one or more cavities are formed in a portion of the thickness of the card support; providing a subassembly formed of the components to be mounted in the cavity or cavities facilitates the mounting and connecting operations independently of the housing or housings in the support.

According to preferred features of the invention, which may in some cases be combined:

the subassembly further includes an interface component connected between the microcircuit and the accessible component; the invention in fact applies to any number of components in addition to the microcircuit component; the other component may in particular be a controller for the accessible component;

the connections within the subassembly are made by connecting wires, which is a proven electrical connection method;

each connecting wire is connected, firstly, to the microcircuit or to a component, and, secondly, to a connecting track carried by the support film;

the housing includes at least one cavity in which the microcircuit is fixed and one cavity in which the accessible component is fixed, at least one rib being provided between the cavities;

the support film includes an area mechanically weakened in bending between at least the microcircuit and a component and adapted to bear against a rib; a mechanically weakened area of this kind is advantageously formed on either side of the microcircuit and of each component;

other mechanically weakened areas may be provided transversely to the first areas, making the subassembly even more flexible;

each mechanically weakened area preferably includes at least one slot;

connecting tracks are formed between the microprocessor and each component, each track facing a rib and being crossed by at least one mechanically weakened area;

the support film includes mechanically weakened areas that are parallel, or even areas of this kind disposed in at least two directions;

each cavity is filled with a rigid material containing the microcircuit or a component and extending as far as the support film;

each cavity is provided at the periphery of its bottom with at least one depression; By analogy with the above comments in respect of the smart card of the invention, the fabrication method may advantageously have the following features, where applicable in combination:

a cavity for the microcircuit and a cavity for the accessible component are formed in the housing;

areas mechanically weakened in bending are formed in the support film at least between the microcircuit and the accessible component;

areas mechanically weakened in bending are formed in the support film on either side of the microcircuit and of each component; other areas mechanically weakened in bending may also be provided transversely (for example perpendicularly) to the first areas;

the areas mechanically weakened in bending are formed by slots;

at least one area mechanically weakened in bending is disposed facing a rib formed in the housing between two cavities;

connecting tracks connected by wires to the microcircuit or to a component are crossed by the areas mechanically weakened in bending;

at least one depression is formed at the periphery of the bottom of at least one cavity;

a plurality of areas mechanically weakened in bending that and parallel or disposed in two or more directions are provided in the support film.

BRIEF DESCRIPTION OF THE SEVERAL VIEWS OF THE DRAWING

Aspects, features and advantages of the invention emerge from the following description, which is given by way of nonlimiting illustrative example with reference to the appended drawings, in which.

DETAILED DESCRIPTION OF THE INVENTION

Figure 1:
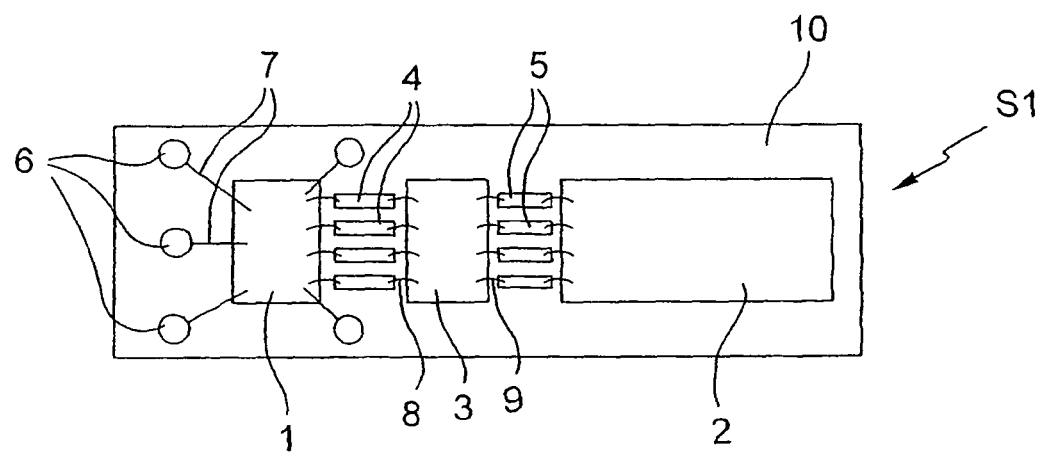
FIG. 1 is a view of a subassembly formed of various components as seen from the inside.
Figure 2:
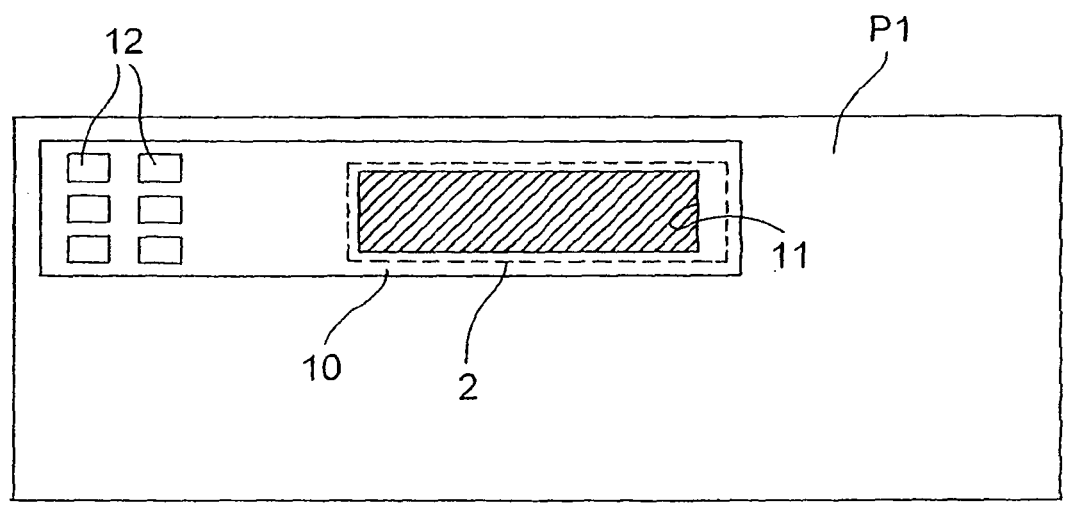
FIG. 2 is a top view of the card obtained from the above subassembly, the latter being seen from the side opposite that shown in FIG. 1.

FIGS. 1 and 2 represent a subassembly S1, in isolation or in a card in the finished state.

The subassembly S1 includes a microcircuit 1 that in practice includes a microprocessor, an accessible component and, in this example, an interface component 3, for example a controller of the accessible component 2. The accessible component 2 is a display device, for example, but may be of any other kind, for example a detection or emission component intended to be integrated into the card.

In this example there are connecting tracks or strips 4 and 5 between the components and connecting areas 6 around the microcircuit 1. The microcircuit 1 is connected to the connecting areas by means of connecting wire 7 and to the interface component 3 via the connecting tracks 4 by means of connecting wires 8, and the interface component is connected to the accessible component 2 via the connecting tracks 5 by means of other connecting wires 9.

The components 1, 2 and 3 and the connecting tracks 4 and 5 are mounted on a support film 10 in which a window 11 is formed. External contacts 12 on the face opposite that on which the above components are mounted are connected to the connecting areas 6 by means that are not shown. In a variant that is not shown, the areas 6 are omitted and the microcircuit is connected directly to the external contacts 12, the connecting wires passing through the support film in a manner that is known in the art (the reference number 6 then designates the holes in the card support by means of which the wires pass through the support film). In another variant that is not shown, the connecting tracks 4 and 5 may be omitted, the connecting wires 8 and 9 providing a direct connection from the microcircuit to the interface component and from the latter to the accessible component. The benefit of these connecting tracks is that the wires 8 and 9 can be shorter. Another advantage will emerge from the description of the subsequent figures.

The window 11 is smaller than the interface component, with the result that the latter remains in contact with the support film 10 over at least a portion of its periphery. In the present example, the component remains in contact with the support film over the whole of its periphery, but it could instead be in contact with the film only at its ends, for example.

Whereas conventionally it is often a question of a module formed of a thin support carrying the microcircuit on one face and its external contacts on another face, the invention uses a module that is larger because it includes other components, in this example all the other electronic components.

The components may be fixed to the support film by any appropriate means known in the art, for example bonded or glued. The connecting tracks, the connecting areas, if any, and the external contacts can be obtained by depositing a metal, for example, or by any other appropriate means.

It is preferable if the subassembly occupies substantially all of the area of the housing that is formed in the card support P1.

The subassembly may be mounted in a single cavity, into which it is glued or fixed by means of a resin in which the components are embedded, in the same way as modules consisting simply of microcircuits and external contacts are fixed, although this does not imply completely filling the cavity.

However, as is clear from FIGS. 3 to 6, the subassembly can advantageously be mounted instead in a plurality of cavities formed in the card support P2.

In this variant, the subassembly S2 has the same structure as the subassembly S1 from FIGS. 1 and 2 except that transverse bending slots are formed in the thickness of the support film 10.

The bending slots are advantageously at a distance from the components 1, 2 and 3. Thus in the present example there are two slots F1 and F2 on either side of the microcircuit 1, two slots F3 and F4 on either side of the interface component 3, and two slots F5 and F6 on either side of the accessible component 2. The slots define areas mechanically weakened in bending, especially when they form a pair (F2+F3, F4+F5).

In the present example the slots are V-shaped and, for clarity, are represented as passing completely through the thickness of the support film 10. It must nevertheless be clearly understood that other shapes are possible (crenellations, etc.) and that the slots preferably extend through only a portion of the thickness of the support film, to maintain the continuity thereof.

Note that the slots F2 and F3 extend across the connecting tracks 4 and that the slots F4 and F5 extend across the connecting tracks 5.

Figure 3:
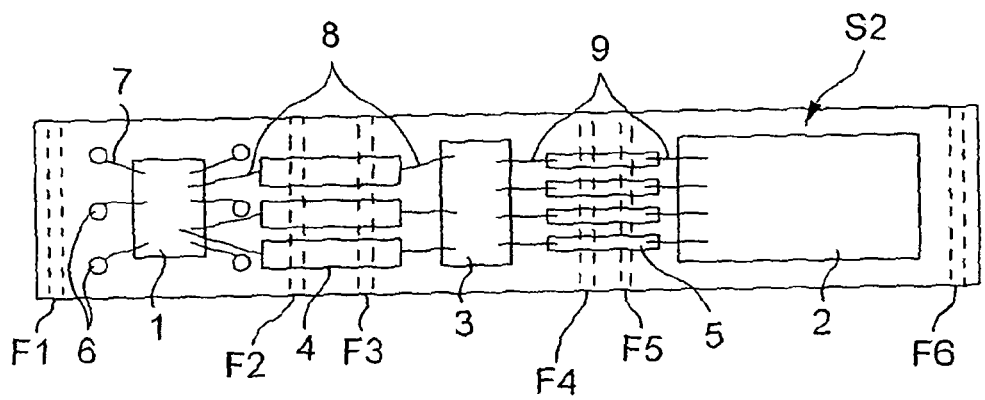
FIG. 3 is a bottom view, analogous to that of FIG. 1, of a subassembly of a preferred embodiment of the invention.
Figure 4:
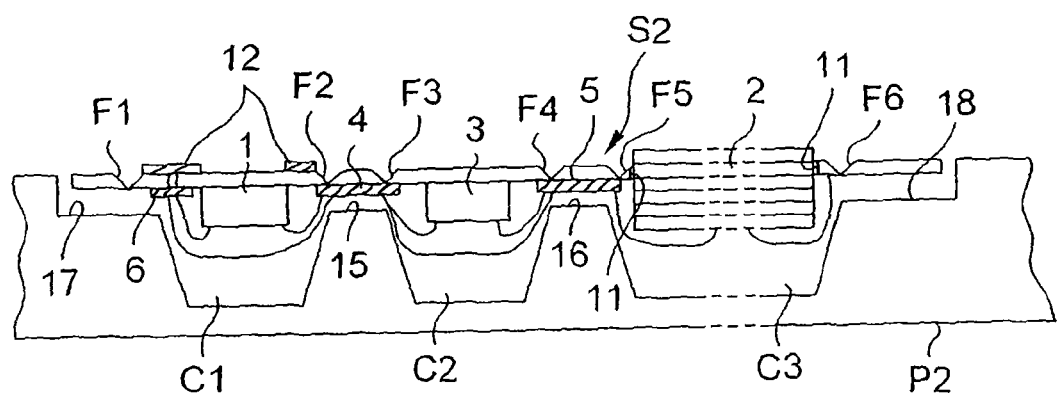
FIG. 4 is a view in section of the above subassembly positioned on top of a plurality of cavities formed in a card support.
Figure 5:
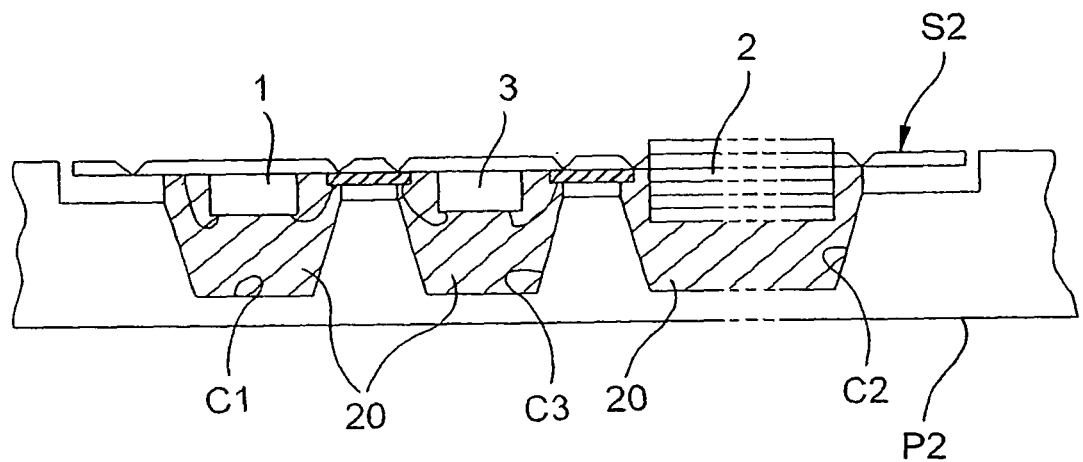
FIG. 5 is a view analogous to that of FIG. 4, after filling the cavities with a fixing resin.

FIGS. 4 and 5 are not to the same scale as FIG. 3, to make them clearer, and show that a cavity is formed in the card support under each component, between the slots flanking the component. Thus the card support P2 includes a housing including a cavity C1 for the microcircuit 1, a cavity C2 for the accessible component 2 and a cavity C3 for the interface component.

In a variant that is not shown, the same cavity may house two components or there may be two or more cavities for one component having some flexibility.

Note that, in the present example, the connecting tracks 4 and 5 therefore overlie the ribs 15 and 16 separating the cavities C1 and C3 and the cavities C3 and C2, respectively, flanking each of them on either side; plateaus 17 and 18 are additionally formed at the ends of the housing, beside the cavities C1 and C3 respectively, under the slots F1 and F6.

FIG. 4 is a diagram of the microcircuit 1, the components 2 and 3, the connecting tracks 4 and 5, a connecting area 6 and two external contacts 12; the connecting wires are also shown diagrammatically (including any wires circumventing the component concerned), without claiming to show all of the connections. Nevertheless, note that each component is at least in part contained in a specific cavity, the connections between cavities being made by the connecting tracks. In the variant considered above in which the tracks are omitted, the wires would have to be sufficiently long to pass over the ribs 15 and 16.

Note also that the accessible component 2 in FIG. 4 is formed of a stack of layers, some of which project out of the housing; nevertheless, the component can of course be entirely contained within the housing of the card support P2. Moreover, all the layers are shown as having the same dimensions, but in practice they may advantageously have different dimensions, with internal layers that are larger than layers disposed on the outside thereof, whereby the internal layers may be used for mechanical fixing of the component to the support film (by gluing or by any other appropriate means).

An encapsulation resin may be applied over each component before fixing it in the housing of the card support, but it is preferable if an encapsulation resin is placed in each cavity before placement of the subassembly. In this regard see the documents EP-1 050 844 (or U.S. Pat. No. 6,372, 541) and EP-1 050 845 or EP-0 519 564 (or U.S. Pat. Nos. 5,585,669 or 5,438,750).

As is clear from FIG. 5, the encapsulation resin advantageously fills the cavities completely, without covering (at least not completely) either the plates or the tops of the ribs. As a result the encapsulation resin 20 adheres to the bottom of the cavity, creating in each cavity rigid blocks (or links) consisting of the cavity, the component that is disposed therein with the quantity of resin coating it, and the portion of support film situated between the two slots that flank the cavity concerned. By contrast, the space between the blocks, i.e. between the slots F2 and F3, F4 and F5, or the ends of the support film, on the outside of the slots F1 and F6, constitute hinges in which any bending forces which the card may be subjected in service are localized, which minimizes the stresses to which the components are subjected in service. There is obtained in this way a card having a certain flexibility without the components themselves being stressed.

Note that in the present example the slots F1 to F6 are parallel and transverse to the greatest dimension of the support film.

In a variant that is not shown, other areas mechanically weakened in bending are provided in the support film transversely (for example perpendicularly) to the slots F1 to F6. This may in particular be useful if the components are not disposed in a single line but in a two-dimensional array (orthogonal or otherwise), slots being provided in each direction, preferably away from the components.

In a further embodiment that is not shown, the slots F1 to F6 are inclined at different angles, for example with the slots F2 and F3 both inclined upward and to the right and the slots F4 and F5 both inclined upward and to the left. As a result, depending on the instantaneous stress regime, the hinge effect will be primarily localized in the slots F1 and F6, in the slots F2 and F3 or in the slots F4 and F5.

Figure 6:
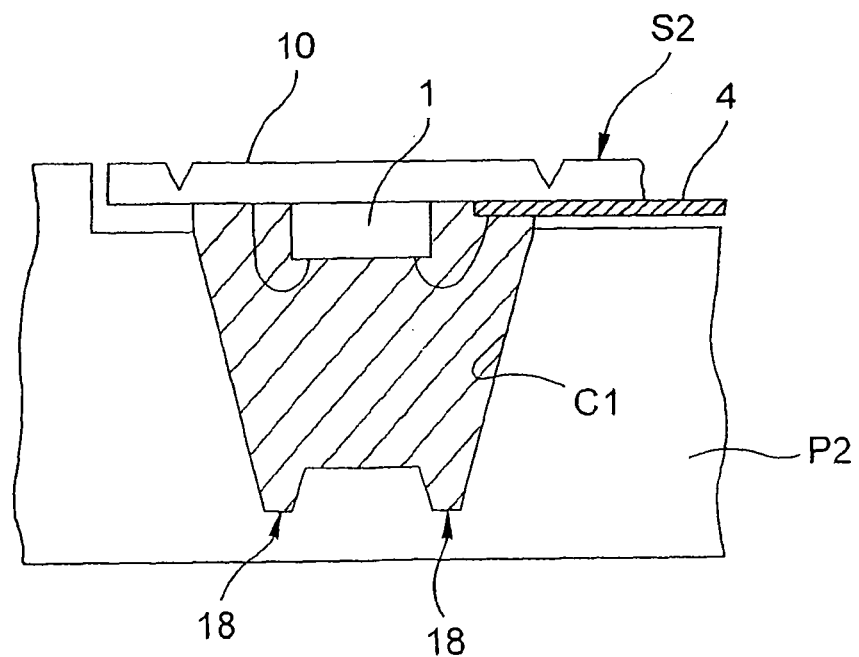
FIG. 6 is a detail view of a cavity conforming to a different embodiment.

In the FIG. 6 variant, the bottom of the cavity is not completely flat, but incorporates a depression 18 (a peripheral groove or a succession of hollows), which has the advantage of localizing stresses at the periphery of the bottom of the cavities.

The card support is subjected to high stresses at this location, which conventionally relieves other areas. However, to minimize the risk of breakage, the card support is advantageously made from a high-strength polymer such as polycarbonate (PC) or polyethyleneterephthalate (PETF) rendered crystalline by stretching it.

Note that the fabrication of the smart card therefore includes the following steps:

assembling a subassembly S1 or S2 by mounting on a support film 10 the various components (microcircuit, accessible component and controllers, if any), for example by bonding or gluing, providing in the film a window for access (at least visual access) to the accessible component, and providing connections by means of connecting wires, the support film being preferably provided with bending slots between the components, forming a housing (C1+C2+C3) in the card support, advantageously comprising as many cavities as there are components, fixing the subassembly into the housing, advantageously by fixing each of the components into a cavity of the housing, such fixing preferably being effected by means of an encapsulation resin filling each cavity of the housing.

Note that the subassembly may easily be produced by standard gluing and wire soldering equipment conventionally used to produce smart card modules consisting simply of a microcircuit and its external contacts; it can then easily be fitted by means of conventional means for placement of these "simple" modules.

The window formed in the support film does not prevent covering the accessible component with a transparent film to protect it.

The invention claimed is:

1. A smart card comprising:
    a card support with a housing formed in a portion of the thickness of said card support, the card support having first and second surfaces opposite one another, the housing being defined at the first surface of the card support; and
    a subassembly fixed in the housing at a portion of the first surface of the card support, the subassembly comprising a support film having an internal face and an external face and provided with a window, the subassembly further comprising
        a plurality of external contacts provided on the external face of the support film, and
        a microcircuit and at least one other component both mounted on the internal face of the support film,
    the window being located facing the other component, the other component being an accessible component which is accessible on the surface of the smart card through the window,
    wherein an external face of the subassembly and the first surface constitute a first external face of the smart card, and the second surface of the card support constitutes an opposite external face of the smart card.

2. The smart card according to claim 1, wherein the subassembly further includes an interface component connected between the microcircuit and the accessible component.

3. The smart card according to claim 2, wherein the interface component is a controller for the accessible component.

4. The smart card according to claim 1, wherein the connections within the subassembly are made by connecting wires.

5. The smart card according to claim 4, wherein each connecting wire is first connected to the microcircuit or to a component, and secondly connected to a connecting track carried by the support film.

6. The smart card according to claim 1, wherein the housing includes at least one cavity in which the microcircuit is fixed and one cavity in which the accessible component is fixed, at least one rib being provided between the cavities.

7. The smart card according to claim 6, wherein the support film includes an area mechanically weakened in bending between at least the microcircuit and a component and configured to bear against a rib.

8. The smart card according to claim 7, wherein a mechanically weakened area is formed on either side of the microcircuit and of each component.

9. The smart card according to claim 6, wherein connecting tracks are formed between the microcircuit and each component, each track facing a rib and being crossed by at least one mechanically weakened area.

10. The smart card according to claim 7, wherein each mechanically weakened area includes at least one slot.

11. The smart card according to claim 10, wherein each cavity is provided at the periphery of its bottom with at least one depression.

12. The smart card according to claim 6, wherein each cavity is filled with a rigid material containing the microcircuit or a component and extending as far as the support film.

13. The smart card according to claim 1, wherein the housing comprises at least one cavity where at least a portion of the subassembly is fixed by a resin.

14. A method for fabricating a smart card comprising:
    providing a card support having first and second surfaces opposite one another and forming a housing in the card support in a portion of the thickness of the card support at the first surface of the card support;
    assembling a subassembly by providing a support film having an internal face and an external face and provided with a window, providing a plurality of external contacts on the external face of the support film, and mounting a microcircuit and at least one other component on the internal face of the support film, the window being located facing the other component; and
    after forming the card support and the housing, fixing the subassembly in the housing at a portion of the first surface of the card support,
    wherein the other component is an accessible component which is accessible on the surface of the smart card through the window, and
    wherein an external face of the subassembly and the first surface constitute a first external face of the smart card, and the second surface of the card support constitutes an opposite external face of the smart card.

15. The method according to claim 14, wherein a cavity for the microcircuit and a cavity for the accessible component are formed in the housing.

16. The method according to claim 15, wherein areas mechanically weakened in bending are formed in the support film at least between the microcircuit and the accessible component.

17. The method according to claim 16, wherein areas mechanically weakened in bending are formed in the support film on either side of the microcircuit and of each component.

18. The method according to claim 15, wherein at least one area mechanically weakened in bending is disposed facing a rib formed in the housing between two cavities.

19. The method according to claim 16, wherein the areas mechanically weakened in bending are formed by slots.

20. The method according to claim 15, wherein connecting tracks connected by wires to the microcircuit or to a component are crossed by the areas mechanically weakened in bending.

21. The method according to claim 15, wherein at least one depression is formed at the periphery of the bottom of at least one cavity.

22. The method according to claim 14, wherein the forming of a housing in the card body comprises forming at least one cavity for at least a portion of the subassembly, and
wherein the fixing of the at least a portion of the subassembly in the at least one cavity is made with a resin.

* * * * *